(12) United States Patent
Sakai

(10) Patent No.: US 10,389,351 B2
(45) Date of Patent: Aug. 20, 2019

(54) SEMICONDUCTOR APPARATUS

(71) Applicant: FUJI ELECTRIC CO., LTD., Kanagawa (JP)

(72) Inventor: Yasuaki Sakai, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/114,218

(22) Filed: Aug. 28, 2018

(65) Prior Publication Data
US 2019/0103866 A1   Apr. 4, 2019

(30) Foreign Application Priority Data

Oct. 3, 2017  (JP) .................. 2017-193433

(51) Int. Cl.
| | | |
|---|---|---|
| *H02H 7/122* | (2006.01) | |
| *G05F 1/00* | (2006.01) | |
| *H02M 3/155* | (2006.01) | |
| *H03K 17/16* | (2006.01) | |
| *H03K 17/14* | (2006.01) | |
| *H03K 17/687* | (2006.01) | |
| *H01L 25/18* | (2006.01) | |

(52) U.S. Cl.
CPC ........... *H03K 17/162* (2013.01); *H01L 25/18* (2013.01); *H03K 17/145* (2013.01); *H03K 17/687* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,714,624 B2* | 5/2010 | Takasu | ............ | H03K 17/08142 327/110 |
| 8,890,496 B2* | 11/2014 | Inoue | .................... | H02M 3/158 323/271 |
| 9,245,956 B2* | 1/2016 | Okumura | ............... | H02M 7/003 |
| 2009/0206812 A1 | 8/2009 | Sasaya et al. | | |

FOREIGN PATENT DOCUMENTS

| | | |
|---|---|---|
| JP | 2009195054 A | 8/2009 |
| JP | 2013165498 A | 8/2013 |
| JP | 2016116358 A | 6/2016 |

* cited by examiner

*Primary Examiner* — An T Luu

(57) ABSTRACT

Reverse recovery current flowing through a MOSFET (Metal Oxide Semiconductor Field Effect Transistor) having been turned off can become reverse recovery loss. Reverse recovery loss of the MOSFET is desirably reduced. A semiconductor apparatus including: a MOSFET portion; and a diode portion connected in anti-parallel with the MOSFET portion, wherein reverse recovery current flows through the diode portion after reverse recovery current of the MOSFET portion becomes zero is provided.

8 Claims, 12 Drawing Sheets

SEMICONDUCTOR APPARATUS

The contents of the following Japanese patent application(s) are incorporated herein by reference:
NO. 2017-193433 filed in JP on Oct. 3, 2017.

BACKGROUND

1. Technical Field

The present invention relates to a semiconductor apparatus.

Conventionally, reverse recovery current is reduced by applying voltage to the gate of an MOS transistor (please see Patent Document 1, for example). In addition, ohmic loss is reduced by making approximately zero the average value of current differences (ir−i2) between current ir flowing through a first commutation path in a first diode 42h and current i2 flowing through a second commutation path including a second diode 43h and an inductance L2 that are connected in parallel with the first diode 42h (please see Patent Document 2, for example).

PRIOR ART DOCUMENTS

Patent Documents

[Patent Document 1] Japanese Patent Application Publication No. 2013-165498
[Patent Document 2] Japanese Patent Application Publication No. 2009-195054

Reverse recovery current flowing through a MOSFET (Metal Oxide Semiconductor Field Effect Transistor) having been turned off can become reverse recovery loss. Reverse recovery loss of the MOSFET is desirably reduced.

SUMMARY

A first aspect of the present invention provides a semiconductor apparatus. The semiconductor apparatus may include a MOSFET portion and a diode portion. The diode portion may be connected in anti-parallel with the MOSFET portion. In the semiconductor apparatus, reverse recovery current may flow through the diode portion after reverse recovery current of the MOSFET portion becomes zero.

The diode portion may have a forward voltage lower than a forward voltage of a parasitic diode of the MOSFET portion.

The semiconductor apparatus may further include a first inductance portion and a second inductance portion. The first inductance portion may be connected in series with the MOSFET portion. Inductance of the first inductance portion may be $L_a$. The second inductance portion may be connected in series with the diode portion. The inductance of the second inductance portion may be $L_b$. The $L_a$ of the first inductance portion may be lower than the $L_b$ of the second inductance portion.

If it is assumed that: reverse recovery time of the MOSFET portion is $T_{rra}$; and voltage applied between a first connection point which is one end of the parallel circuit portion and a second connection point which is another end opposite to the one end of the parallel circuit portion is $V_{DD2}$; current flowing through the MOSFET portion is $I_{Fa}$; and current flowing through the diode portion is $I_{Fb}$, $I_{Fa} \cdot L_a + T_{rra} \cdot V_{DD2} < I_{Fb} \cdot L_b$ may hold true. A parallel circuit portion may have the MOSFET portion and the first inductance portion, and the diode portion and the second inductance portion. In the parallel circuit portion, the MOSFET portion and the first inductance portion, and the diode portion and the second inductance portion may be connected in parallel.

The semiconductor apparatus may further include a third inductance portion and a fourth inductance portion. The third inductance portion may be connected in series with the first connection point of the parallel circuit portion. The third inductance portion having inductance which is $L_x$ may be constituted by a part of a lead frame. The fourth inductance portion may be connected in series with the second connection point of the parallel circuit portion. The fourth inductance portion having inductance which is $L_y$ may be constituted by a part of a lead frame. A sum of the $L_x$ and the $L_y$ may be sufficiently larger than both the $L_a$ and the $L_b$.

The first inductance portion may have a first wire and a first region of the first lead frame. The first region may be different from the part of the first lead frame which is the third inductance portion. The first region may be in contact with the first wire. The second inductance portion may have a second wire and a second region of the first lead frame. The second region may be different from the part of the first lead frame which is the third inductance portion and the first region of the first lead frame. The second region may be in contact with the second wire. A thickness of the first region may be larger than a thickness of the second region.

The first inductance portion may have a first wire. The second inductance portion may have a second wire. The fourth inductance portion may have a third wire. A length of the third wire may be longer than both a length of the first wire and a length of the second wire, or instead of this, a diameter of the third wire may be smaller than both a diameter of the first wire and a diameter of the second wire.

The first inductance portion may have one or more first wires. The second inductance portion may have one or more second wires. The fourth inductance portion may have one or more third wires. The number of the third wires may be smaller than both the number of the first wires and the number of the second wires.

The first inductance portion may have one or more first wires. The second inductance portion may have two or more second wires. The number of the first wires may be smaller than the number of the second wires.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
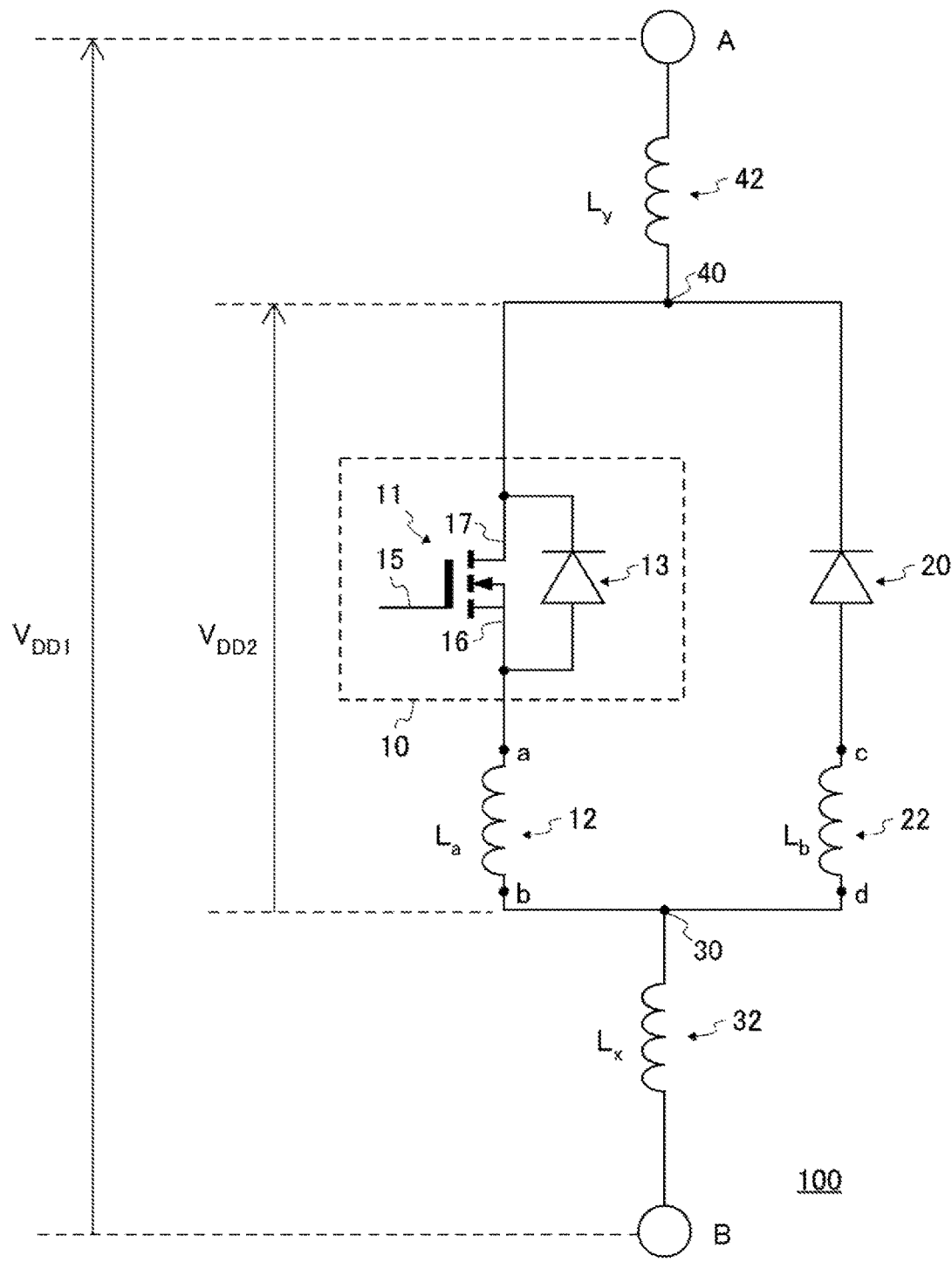
FIG. 1 is a figure showing an equivalent circuit 100 which constitutes a part of a semiconductor apparatus in a first embodiment.

FIG. 1 is a figure showing an equivalent circuit 100 which constitutes a part of a semiconductor apparatus in a first embodiment. The equivalent circuit 100 constitutes a part of, for example, a power semiconductor module having one or more MOSFET semiconductor chips and one or more diode semiconductor chips. The equivalent circuit 100 in the present example has a MOSFET portion 10, a diode portion 20, a first inductance portion 12, a second inductance portion 22, a third inductance portion 32 and a fourth inductance portion 42. In another example, either the third inductance portion 32 or the fourth inductance portion 42 may be omitted from the equivalent circuit 100.

The MOSFET portion 10 may have a MOSFET 11 and a parasitic diode 13. The MOSFET 11 may have a gate 15, a source 16 and a drain 17. The gate 15, source 16 and drain 17 may correspond to the gate electrode, source electrode and drain electrode of a MOSFET semiconductor chip, respectively. If a predetermined high voltage is applied to the gate 15 in the state where a predetermined voltage higher than a voltage applied to the source 16 is applied to the drain 17, the MOSFET 11 can be turned on. Thereby, it is possible to cause current to flow from the drain 17 to the source 16. In addition, if the MOSFET 11 is turned off by applying a predetermined low voltage to the gate 15, it is possible to block current flowing from the drain 17 to the source 16.

The parasitic diode 13 may be connected in anti-parallel with the MOSFET 11. The parasitic diode 13 may be formed by a PN junction between a P-type base layer and an N-type drift layer of the MOSFET 11. The parasitic diode may be expressed as a built-in diode in some cases, but in the present example, it is consistently described as a parasitic diode. The anode and cathode in the parasitic diode 13 may electrically connects with the source 16 and drain 17 of the MOSFET 11, respectively. If the MOSFET 11 is turned off, current such as reverse recovery current flows through the MOSFET portion 10 due to the parasitic diode 13.

The diode portion 20 may be connected in anti-parallel with the MOSFET portion 10. The diode portion 20 may function as a free wheel diode that causes current to flow from the anode to the cathode if the MOSFET 11 is turned off. In the present example, the anode of the diode portion 20 electrically connects with the source 16 of the MOSFET 11, and the cathode of the diode portion 20 electrically connects with the drain 17 of the MOSFET 11.

The diode portion 20 may have a forward voltage (forward voltage is referred to as $V_F$) lower than $V_F$ of the parasitic diode 13 of the MOSFET portion 10. Due to a load to which the equivalent circuit 100 is connected, a free wheel current can flow through the equivalent circuit 100 in the OFF state. By lowering $V_F$ of the diode portion 20, heat-generation due to a free wheel current flowing through the equivalent circuit 100 in the OFF state can be reduced. Although the diode portion 20 in the present example is a Schottky barrier diode (also referred to as SBD) formed by a junction between a metal and a semiconductor, the diode portion 20 in another example may be a diode having a pn junction.

The SBD diode element can have a p-type guard ring region that is provided to surround the circumference of a main junction region between a metal layer and an n-type semiconductor layer, and functions as an edge termination structure portion. Due to the pn junction between the n-type semiconductor layer and the p-type guard ring region, a reverse recovery current can flow also through the SBD diode element.

The first inductance portion 12 (inductance $L_a$) may be connected in series with the MOSFET portion 10. In addition, the second inductance portion 22 (inductance $L_b$) may be connected in series with the diode portion 20. In the present example, a first end portion "a" of the first inductance portion 12 electrically connects with the source 16, and a second end portion b of the first inductance portion 12 electrically connects with a second end portion d of the second inductance portion 22. In addition, a first end portion c of the second inductance portion 22 electrically connects with the anode of the diode portion 20.

In the present example, the second end portion b of the first inductance portion 12 and the second end portion d of the second inductance portion 22 electrically connect with a first end portion of the third inductance portion 32 (inductance $L_x$) at a first connection point 30. A second end portion of the third inductance portion 32 is treated as a terminal B. In addition, in the present example, the drain 17 of the MOSFET 11 and the cathode of the diode portion 20 electrically connect with a second end portion of the fourth inductance portion 42 (inductance $L_y$) at a second connection point 40. A first end portion of the fourth inductance portion 42 is treated as a terminal A.

In the present example, the MOSFET portion 10 and first inductance portion 12 and the diode portion 20 and second inductance portion 22 are connected in parallel between the terminal A and the terminal B, and constitute a parallel circuit portion. The first connection point 30 constitutes one end of the parallel circuit portion, and the second connection point 40 constitutes another end opposite to the one end of the parallel circuit portion. In the present example, the first end portion of the third inductance portion 32 connects in series with the first connection point 30 of the parallel circuit portion, and the second end portion of the fourth inductance portion 42 connects in series with the second connection point 40 of the parallel circuit.

In the present example, a power-supply voltage applied between the terminal A and the terminal B is treated as $V_{DD1}$, and a voltage applied between the first connection point 30 and the second connection point 40 is treated as $V_{DD2}$. In addition, the potential of the terminal A is assumed to be higher than the potential of the terminal B. One end of the load may electrically connect with the terminal A, and the other end of the load may electrically connect with the terminal B. Following turning on and turning off of the MOSFET portion 10, the voltage $V_{DD1}$ and voltage $V_{DD2}$ may change over time.

Figure 2:
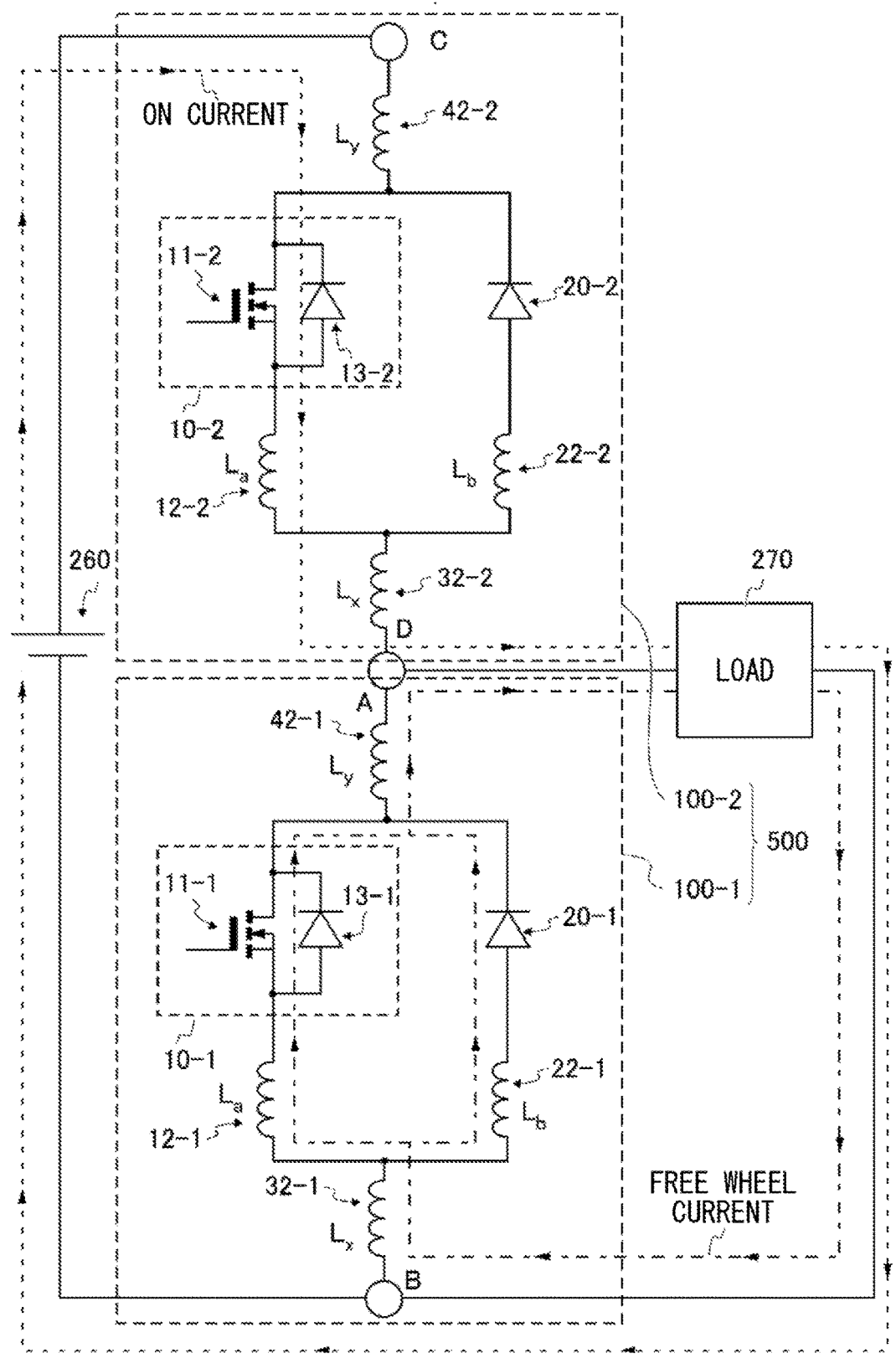
FIG. 2 is a figure showing an equivalent circuit 500 having an equivalent circuit 100-1 and an equivalent circuit 100-2 connected in series.

FIG. 2 is a figure showing an equivalent circuit 500 having an equivalent circuit 100-1 and an equivalent circuit 100-2 connected in series. In the present example, the equivalent circuit 100-1 and 100-2 have the same configuration. The equivalent circuit 100-1 may function as a so-called lower arm in an inverter circuit, and the equivalent circuit 100-2 may function as a so-called upper arm in the inverter circuit.

A terminal C of the equivalent circuit 100-2 corresponds to a terminal A of an equivalent circuit 100-1. In addition, a terminal D of the equivalent circuit 100-2 corresponds to a terminal B of the equivalent circuit 100-1. In FIG. 2, the terminal A and terminal D may be viewed as the same terminal. In the present example, the terminal C connects with the positive side of a power-supply portion 260. In addition, the terminal A and terminal D connect with one end of a load 270. The terminal B connects with the other end of the load 270 and the negative side of the power-supply portion 260.

The semiconductor apparatus in the present example has one equivalent circuit 500. If a MOSFET portion 10-2 of the equivalent circuit 100-2 is turned on, an ON current may flow through the positive side of the power-supply portion 260→the terminal C→the terminal D→the load 270→the terminal B→and the negative side of the power-supply portion 260 in this order. The ON current is indicated with dotted lines.

In addition, if the MOSFET portion 10-2 of the equivalent circuit 100-2 is turned off, a free wheel current may flow through the terminal A→the load 270→the terminal B→the terminal A in this order, in the equivalent circuit 100-1 and load 270. The free wheel current is indicated with alternate long and dash lines. Subsequently, again, if the MOSFET portion 10-2 of the equivalent circuit 100-2 is turned on, the free wheel current gradually decreases. How it appears when this free wheel current gradually decreases is explained with reference to the next figure.

Figure 3:
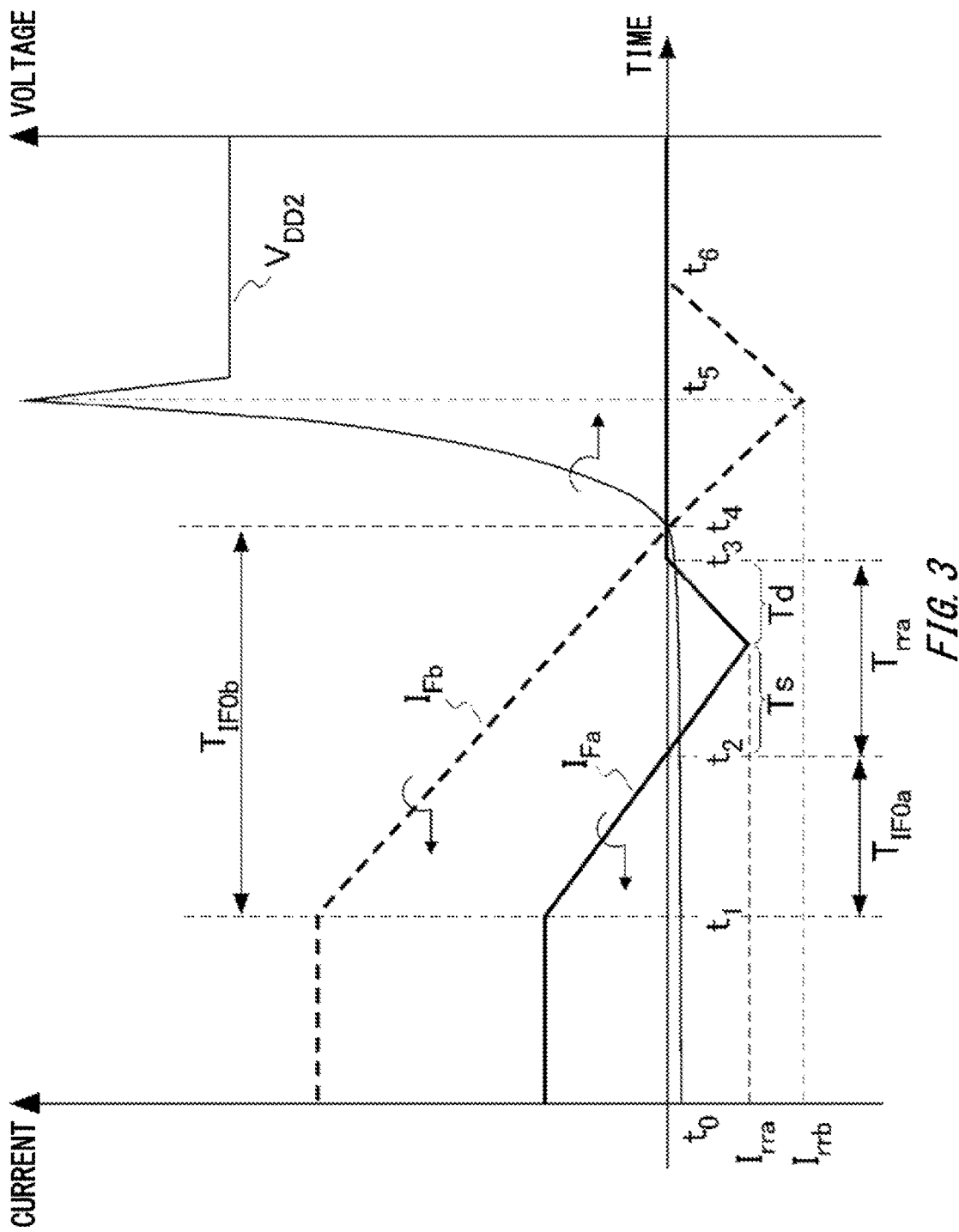
FIG. 3 is a figure showing a summary of a current waveform observed when free wheel current decreases in the equivalent circuit 100-1.

FIG. 3 is a figure showing a summary of a current waveform observed when free wheel current decreases in the equivalent circuit 100-1. The horizontal axis indicates time, the left vertical axis indicates current, and the right vertical axis indicates voltage. In FIG. 3, a free wheel current flowing through a MOSFET portion 10-1 is assumed to be $I_{Fa}$, and a free wheel current flowing through a diode portion 20-1 is assumed to be $I_{Fb}$. In addition, the free wheel current $I_{Fa}$ is indicated with a thick solid line, and the free wheel current $I_{Fb}$ is indicated with a thick broken line. In addition, the voltage $V_{DD2}$ is indicated with a thin solid line. In the free wheel current $I_{Fa}$, if current flows in the direction from the terminal B to the terminal A, the current is assumed to be positive, and in the free wheel current $I_{Fb}$, if current flows in the direction from the terminal B to the terminal A, the current is assumed to be positive. In addition, if the potential of the second connection point 40 is higher than the potential of the first connection point 30, the voltage $V_{DD2}$ is assumed to be positive.

[Clock Times from $t_0$ to $t_1$]

In the present example, an upper arm MOSFET 11-2 is in the OFF state at the clock time $t_0$. In the present example, between the clock times $t_0$ to $t_1$, energy stored in the load 270 in a period during which the MOSFET portion 10-2 is in the ON state is released so that a free wheel current flows through the MOSFET portion 10-1 and diode portion 20-1 (please see the above-mentioned alternate long and dash lines of FIG. 2). In the present example, in the lower arm MOSFET portion 10-1, a constant value current $I_{Fa}$ flows from the drain 17 to the source 16. In addition, in the diode portion 20, a constant value current $I_{Fb}$ larger than that for the MOSFET portion 10 flows.

[Clock Times $t_1$ to $t_2$]

At the clock time $t_1$, the upper arm MOSFET portion 10-2 is turned on. Thereby, the free wheel current flowing through the equivalent circuit 100-1 starts decreasing. In the present example, the clock time $t_1$ is expressed as a clock time at which current blocking is started, in some cases. In the present example, the current $I_{Fa}$ and current $I_{Fb}$ decrease linearly along with the elapse of time between the clock times $t_1$ and $t_2$. At the clock time $t_2$, the current $I_{Fa}$ is assumed to become zero. In the present example, the time range between the clock times $t_1$ and $t_2$ is expressed as $T_{IF0a}$.

[Clock Times $t_2$ to $t_3$]

In the present example, the current $I_{Fa}$ is zero or negative between the clock times $t_2$ and $t_3$. In the present example, that the current $I_{Fa}$ first becomes zero or negative in a period starting when the upper arm MOSFET portion 10-2 is turned on and terminating when it is turned off next is expressed as that a reverse recovery current flows through the MOSFET portion 10. In the present example, the current $I_{Fa}$ decreases linearly for a while even after the clock time $t_2$. Then, the current $I_{Fa}$ starts increasing at a clock time when it becomes $I_{rra}$ which is the peak value of the reverse recovery current, increases linearly, and becomes zero at the clock time $t_3$. That is, the reverse recovery current starts flowing at the clock time $t_2$, becomes the peak value $I_{rra}$ and then becomes zero at the clock time $t_3$. In the present example, the time range between the clock times $t_2$ and $t_3$ is expressed as reverse recovery time $T_{rra}$ of the MOSFET portion 10. In contrast to this, the current $I_{Fb}$ continues decreasing at an approximately constant inclination along with the elapse of time, between the clock times $t_2$ and $t_3$. However, the current $I_{Fa}$ is larger than zero or is zero at the clock time $t_3$. The voltage $V_{DD2}$ starts gradually rising near the clock time $t_3$ due to the MOSFET portion 10-1 being turned on.

[Clock Times $t_3$ to $t_4$]

In the present example, the current $I_{Fa}$ is zero between the clock times $t_3$ and $t_4$. That is, a free wheel current does not flow through the MOSFET portion 10-1 between the clock times $t_3$ and $t_4$. In contrast to this, the current $I_{Fb}$ continues decreasing at an approximately constant inclination along with the elapse of time at the clock time $t_3$, and becomes zero at the clock time $t_4$. In the present example, the time range between the clock times $t_1$ and $t_4$ is expressed as $T_{IF0b}$. The voltage $V_{DD2}$ continues gently rising between the clock times $t_3$ and $t_4$.

[Clock Times $t_4$ to $t_5$]

In the present example, the current $I_{Fb}$ is zero or negative between the clock times $t_4$ and $t_5$. In the present example, that the current $I_{Fb}$ is zero or negative is expressed as that a reverse recovery current flows through the diode portion 20. At the clock time $t_5$, the current $I_{Fb}$ becomes $I_{rrb}$ which is the peak value of the reverse recovery current. The voltage $V_{DD2}$ starts rising rapidly at and after the clock time $t_4$ upon the diode portion 20 starting a reverse recovery operation and becomes the peak value at the clock time $t_5$ at which the current $I_{Fb}$ becomes the peak value $I_{rrb}$.

[Clock Times $t_5$ to $t_6$]

In the present example, the current $I_{Fb}$ starts increasing at the clock time $t_5$ when it becomes the peak value $I_{rrb}$, increases linearly and becomes zero at the clock time $t_6$. After the clock time $t_6$, the current $I_{Fb}$ is zero. The voltage $V_{DD2}$ lowers by a predetermined value after the clock time $t_5$, and becomes a constant value (for example, a value nearly equal to power-supply voltage of the power-supply portion 260) at the clock time $t_6$.

In the present example, respective parameters such as $L_a$ and $L_b$ are adjusted such that a reverse recovery current flows through the diode portion 20-1 at the clock time $t_4$ which is after when the reverse recovery current of the MOSFET portion 10-1 becomes zero (the clock time $t_3$). Because the voltage $V_{DD2}$ starts increasing rapidly between the clock time $t_4$ at which the diode portion 20-1 starts a reverse recovery operation and the clock time $t_6$, if the diode portion 20-1 starts a reverse recovery operation after the clock time $t_3$ at which the MOSFET portion 10-1 ends the reverse recovery operation, the voltage $V_{DD2}$ remains low while the reverse recovery current is flowing through the MOSFET portion 10-1. In the present example, while the reverse recovery current is flowing in the MOSFET portion 10-1, the diode portion 20 is in the midst of blocking of a forward current, and the voltage $V_{DD2}$ is zero or merely negative slightly. In the present example, reverse recovery loss at the MOSFET portion 10-1 can be reduced as compared with the case where the diode portion 20 starts a reverse recovery operation before the clock time $t_3$.

If the reverse recovery time $T_{rra}$ of the MOSFET portion 10-1 is assumed to be the sum of a period Ts during which a reverse recovery current becomes its largest value and a period Td during which the reverse recovery current becomes nearly 0, Td may be made long for improvement in the soft recovery characteristics. In this case, if the diode portion 20-1 starts a reverse recovery operation before the clock time $t_3$, reverse recovery loss that occurs to the MOSFET portion 10-1 tends to increase further. On the other hand, in the present example, reverse recovery loss at the MOSFET portion 10-1 can be reduced as compared with the case where the diode portion 20-1 starts a reverse recovery operation before the clock time $t_3$.

As mentioned above, in order for the diode portion 20-1 to start a reverse recovery operation after the MOSFET portion 10-1 ends a reverse recovery operation, [Equation 1] may hold true.

$$T_{IF0a}+T_{rra}<T_{IF0b} \qquad \text{[Equation 1]}$$

Next, it is examined what conditions need be met about the respective parameters in order for [Equation 1] to hold true. In the time range from the clock time $t_1$ to the clock time $t_6$, $V_{DD1}$ can be expressed as in [Equation 2] if it assumed that a temporal change in current i flowing between the terminal A and the terminal B is di/dt. "X·Y" means the product of X and Y, and "X/Y" means the quotient of X divided by Y.

$$V_{DD1}=\{L_x+L_y+(L_a \cdot L_b)/(L_a+L_b)\} \cdot (di/dt) \qquad \text{[Equation 2]}$$

If both $L_a$ and $L_b$ are sufficiently lower than the sum of $L_x$ and $L_y$, for example if $L_a<(L_x+L_y)/10)$ and $L_b<(L_x+L_y)/10)$, [Equation 2] can approximate [Equation 3].

$$V_{DD1}=(L_x+L_y) \cdot (di/dt) \qquad \text{[Equation 3]}$$

If it is assumed that a current flowing through the first inductance portion 12-1 is $i_a$ and a current flowing through the second inductance portion 22-1 is $i_b$, $i=i_a+i_b$. Transformation of this gives [Equation 4].

$$di/dt=(di_a/dt)+(di_b/dt) \qquad \text{[Equation 4]}$$

In a situation where [Equation 2] to [Equation 4] hold true, the relationship among $V_{DD2}$, $L_a$, $L_b$, $(di_a/dt)$ and $(di_b/dt)$ is expressed as shown in [Equation 5].

$$V_{DD2}=L_a \cdot (di_a/dt)=L_b \cdot (di_b/dt) \qquad \text{[Equation 5]}$$

In addition, taking into consideration time after the clock time $t_1$ during which the current $I_{Fa}$ and current $I_{Fb}$ decrease linearly from constant values to zero, $(di_a/dt)$ and $(di_b/dt)$ can be expressed by [Equation 6] and [Equation 7].

$$di_a/dt=I_{Fa}/T_{IF0a} \qquad \text{[Equation 6]}$$

$$di_b/dt=I_{Fb}T_{IF0b} \qquad \text{[Equation 7]}$$

From [Equation 5] and [Equation 6], [Equation 8] can be obtained. In addition, from [Equation 5] and [Equation 7], [Equation 9] can be obtained.

$$T_{IF0a}=I_{Fa} \cdot (L_a/V_{DD2}) \qquad \text{[Equation 8]}$$

$$T_{IF0b}=I_{Fb} \cdot (L_b/V_{DD2}) \qquad \text{[Equation 9]}$$

By substituting [Equation 8] and [Equation 9] for corresponding elements in [Equation 1], [Equation 10] can be obtained.

$$I_{Fa} \cdot L_a+V_{DD2} \cdot T_{rra}<I_{Fb} \cdot L_b \qquad \text{[Equation 10]}$$

By adjusting the respective parameters such that [Equation 10] holds true, reverse recovery loss ($=I_{Fa} \cdot V_{DD2}$) at the MOSFET portion 10-1 can be reduced. In addition, along with this, heat-generation of the MOSFET portion 10-1 can be reduced so that the risk of the MOSFET portion 10-1 being destroyed due to heat-generation can be lowered.

Because $V_{DD1}$ and $V_{DD2}$ are nearly equal to each other in a situation where [Equation 2] to [Equation 4] hold true, [Equation 10] may be expressed as shown in [Equation 11].

$$I_{Fa} \cdot L_a+V_{DD1} \cdot T_{rra}<I_{Fb} \cdot L_b \qquad \text{[Equation 11]}$$

Figure 4:
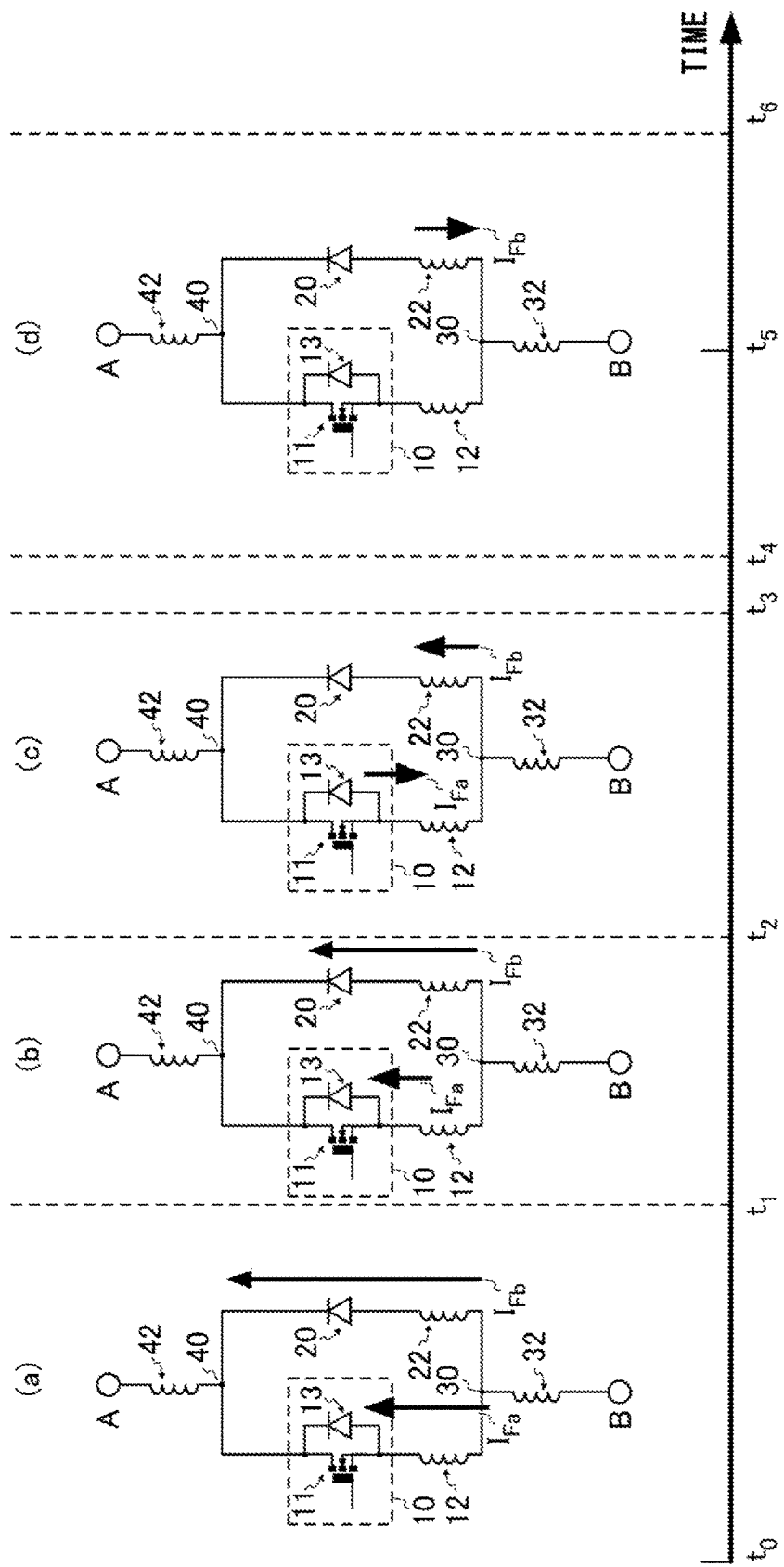
FIG. 4 is a figure in which (a) to (d) show currents $I_{Fa}$ and $I_{Fb}$ at each clock time.

FIG. 4 is a figure in which (a) to (d) show currents $I_{Fa}$ and $I_{Fb}$ at each clock time. The directions of arrows correspond to the directions of currents (that is, the positive and negative directions of the currents $I_{Fa}$ and $I_{Fb}$), and the lengths of the arrows correspond to the magnitudes of the currents. (a) in FIG. 3 corresponds to the clock times $t_0$ to $t_1$, and (b) in FIG. 3 corresponds to the clock times $t_1$ to $t_2$. In addition, (c) in FIG. 3 corresponds to a reverse recovery period of the current $I_{Fa}$ at the clock times $t_2$ to $t_3$, and (d) in FIG. 3 corresponds to a reverse recovery period of the current $I_{Fb}$ at the clock times $t_4$ to $t_6$. Although FIG. 4 shows the equivalent circuit 100-1 corresponding to the lower arm, the notation of "−1" is omitted considering the visibility of the figure. For example, the MOSFET portion 10-1 is indicated as the MOSFET portion 10.

If the above-mentioned adjustment of the respective parameters such as $L_a$ or $L_b$ is not performed, generally, the MOSFET portion 10 has a longer reverse recovery time as compared with the diode portion 20 which is an SBD device. Therefore, due to reverse recovery loss at MOSFET portion 10, the MOSFET portion 10 generates heat, and subsequently this leads to destruction in some cases. The higher the frequency of turning on and turning off the MOSFET portion 10 is, the higher the possibility of the MOSFET portion 10 being destroyed is. In order to avoid this, it is possible to consider employing approaches shown in a first comparative example and a second comparative example. However, the first comparative example and the second comparative example have their own drawbacks as compared with the present embodiment.

Figure 5:
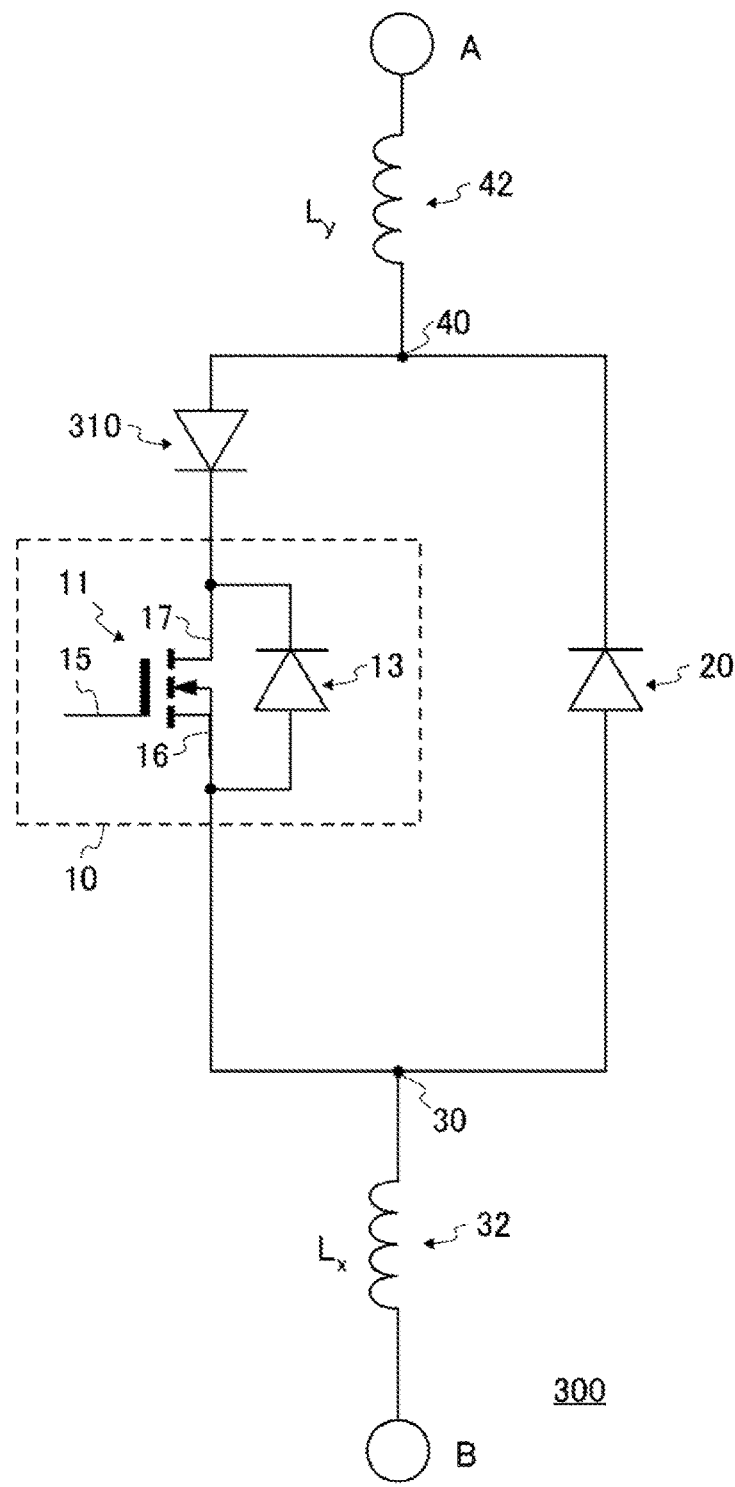
FIG. 5 is a figure showing an equivalent circuit 300 which constitutes a part of a semiconductor apparatus in a first comparative example.

FIG. 5 is a figure showing an equivalent circuit 300 which constitutes a part of a semiconductor apparatus in a first comparative example. The equivalent circuit 300 has a blocking diode 310 in place of the first inductance portion 12 and second inductance portion 22 in the first embodiment. The first comparative example is different from the first embodiment in this respect. The anode of the blocking diode 310 electrically connects with the second connection point 40, and its cathode electrically connects with the drain 17. There is a drawback in the first comparative example that in order for the MOSFET 11 to be turned on, loss increases by $V_F$ of the blocking diode 310 as compared with the first embodiment. In addition, there is a drawback that the number of parts increases corresponding to the addition of the blocking diode 310, and the size of the semiconductor apparatus increases.

Figure 6:
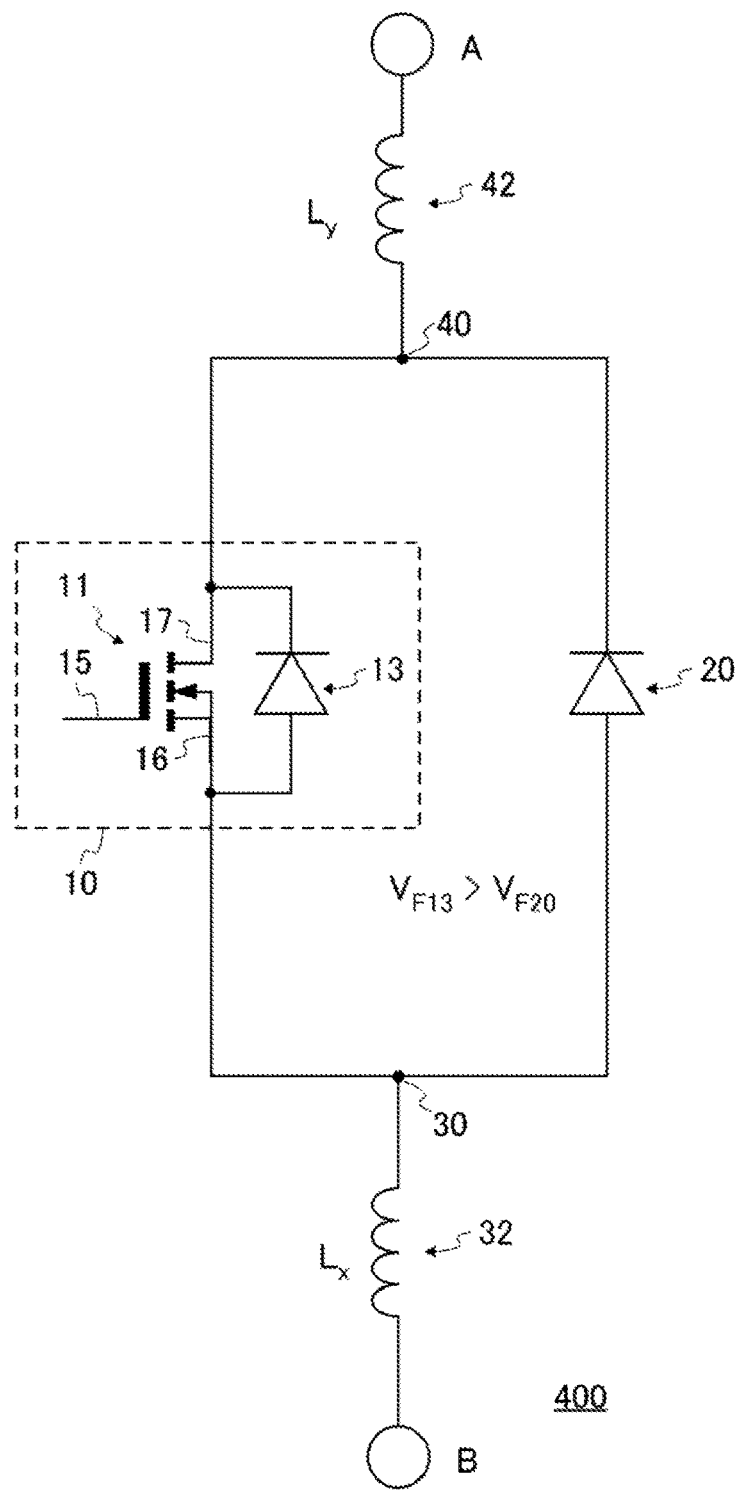
FIG. 6 is a figure showing an equivalent circuit 400 which constitutes a part of a semiconductor apparatus in a second comparative example.

FIG. 6 is a figure showing an equivalent circuit 400 which constitutes a part of a semiconductor apparatus in a second comparative example. The equivalent circuit 400 does not have the blocking diode 310 in the first comparative example. However, in the equivalent circuit 400, the chip area of a semiconductor chip to function as the MOSFET portion 10 is made smaller than the chip area of a semiconductor chip to function as the diode portion 20 so as to make $V_{F13}$ of the parasitic diode 13 higher than $V_{F20}$ of the diode portion 20. Thereby, the parasitic diode 13 of the MOSFET portion 10 is prevented from becoming conductive. The present example is different from the first comparative example in this respect. However, there is a drawback in the second comparative example that the ON resistance of the MOSFET 11 increases as a result of the chip area of the MOSFET portion 10 becoming smaller.

Figure 7:
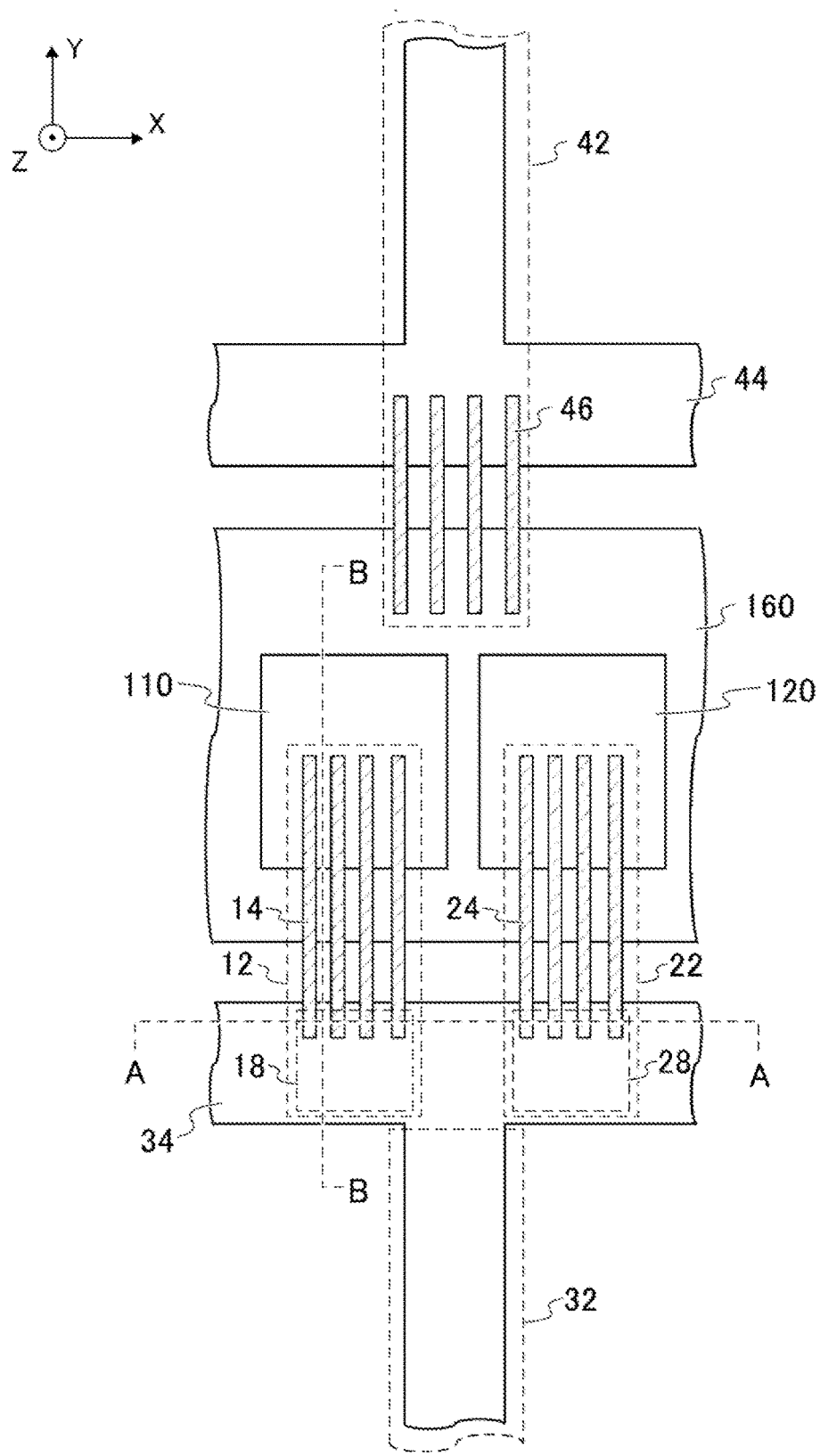
FIG. 7 is a top view of a part of the semiconductor apparatus in the first embodiment.

FIG. 7 is a top view of a part of the semiconductor apparatus in the first embodiment. In FIG. 7, X-, Y- and Z-axes constituting a right-handed system is shown as well. The X-, Y- and Z-axes are used to indicate relative directions of the semiconductor apparatus. The Z-axis direction is not necessarily parallel with the direction of gravity. Although in the present specification, terms like "up" and "on", and "down" and "below" are used as expressions to refer to directions parallel with the Z-axis direction in some cases, these terms are also not limited by the upward/downward directions related to the direction of gravity.

The semiconductor apparatus in the present example has a circuit pattern substrate 160, a first semiconductor chip 110 and a second semiconductor chip 120, a plurality of first wires 14 and a plurality of second wires 24, a first lead frame 34, a second lead frame 44 and a plurality of third wires 46. The first semiconductor chip 110 and second semiconductor chip 120 in the present example are provided on the circuit pattern substrate 160. The circuit pattern substrate 160 is for example a substrate having a wiring pattern formed of copper on an insulating layer. In the present example, the first semiconductor chip 110 is a semiconductor chip to function as the MOSFET portion 10, and the second semiconductor chip 120 is a semiconductor chip to function as the diode portion 20.

In the first semiconductor chip 110, the drain 17 may electrically connect with the wiring pattern of the circuit pattern substrate 160 through a solder layer, and the source 16 may electrically connect with the first lead frame 34 through the first wires 14. In addition, in the second semiconductor chip 120, the cathode may electrically connects with the wiring pattern of the circuit pattern substrate 160 through a solder layer, and the anode may electrically connect with the first lead frame 34 through the second wires 24.

The first inductance portion 12 may have the first wires 14 and a first region 18. The first region 18 is a portion that constitutes a part of an X-axis direction extending portion of the first lead frame 34 and is in contact with the first wires 14. In the present example, the inductance of the first inductance portion 12 is the sum of the inductance of the plurality of first wires 14 and the inductance of the first region 18.

The second inductance portion 22 may have the second wires 24 and a second region 28. Unlike the first region 18, the second region 28 is a portion that constitutes another part of the extending portion, in the X-axis direction, of the first lead frame 34 and is in contact with the second wires 24. In the present example, the inductance of the second inductance portion 22 is the sum of the inductance of the plurality of second wires 24 and the inductance of the second region 28.

In addition, the third inductance portion 32 may have an extending portion, in the Y-axis direction, which constitutes a part of the first lead frame 34. In the present example, the Y-axis direction extending portion of the first lead frame 34 is a region different from the first region 18 and second region 28 which constitute parts of the X-axis direction extending portion of the first lead frame 34, respectively. In contrast to this, the fourth inductance portion 42 in the present example has the plurality of third wires 46, a Y-axis direction extending portion of the second lead frame 44, and a portion which constitutes an intersecting portion of the X-axis direction and the Y-axis direction in the second lead frame 44 and with which the plurality of third wires 46 are in contact.

$L_a$ of the first inductance portion 12 may be lower than $L_b$ of the second inductance portion 22. The inductance $L_b$ may be no lower than 110% of $L_a$, may be no lower than 200% of $L_a$ or may be no lower than 500% of $L_a$. This may contribute to making the left side of [Equation 10] smaller than the right side of [Equation 10]. That is, $L_a<L_b$ can contribute to blocking the current $I_{Fa}$ of the MOSFET portion 10 promptly as compared to the current $I_{Fb}$ of the diode portion 20.

In addition, as has been explained with reference to [Equation 2] and [Equation 3], the sum of the inductances $L_x$ and $L_y$ of the first lead frame 34 may be sufficiently larger than both the inductances $L_a$ and $L_b$. For example, the sum of $L_x$ and $L_y$ can be made sufficiently larger than both $L_a$ and $L_b$ by making the extension length, in the Y-axis direction, of the first lead frame 34 longer than both the length of the first wires 14 and the length of the second wires 24.

Figure 8:
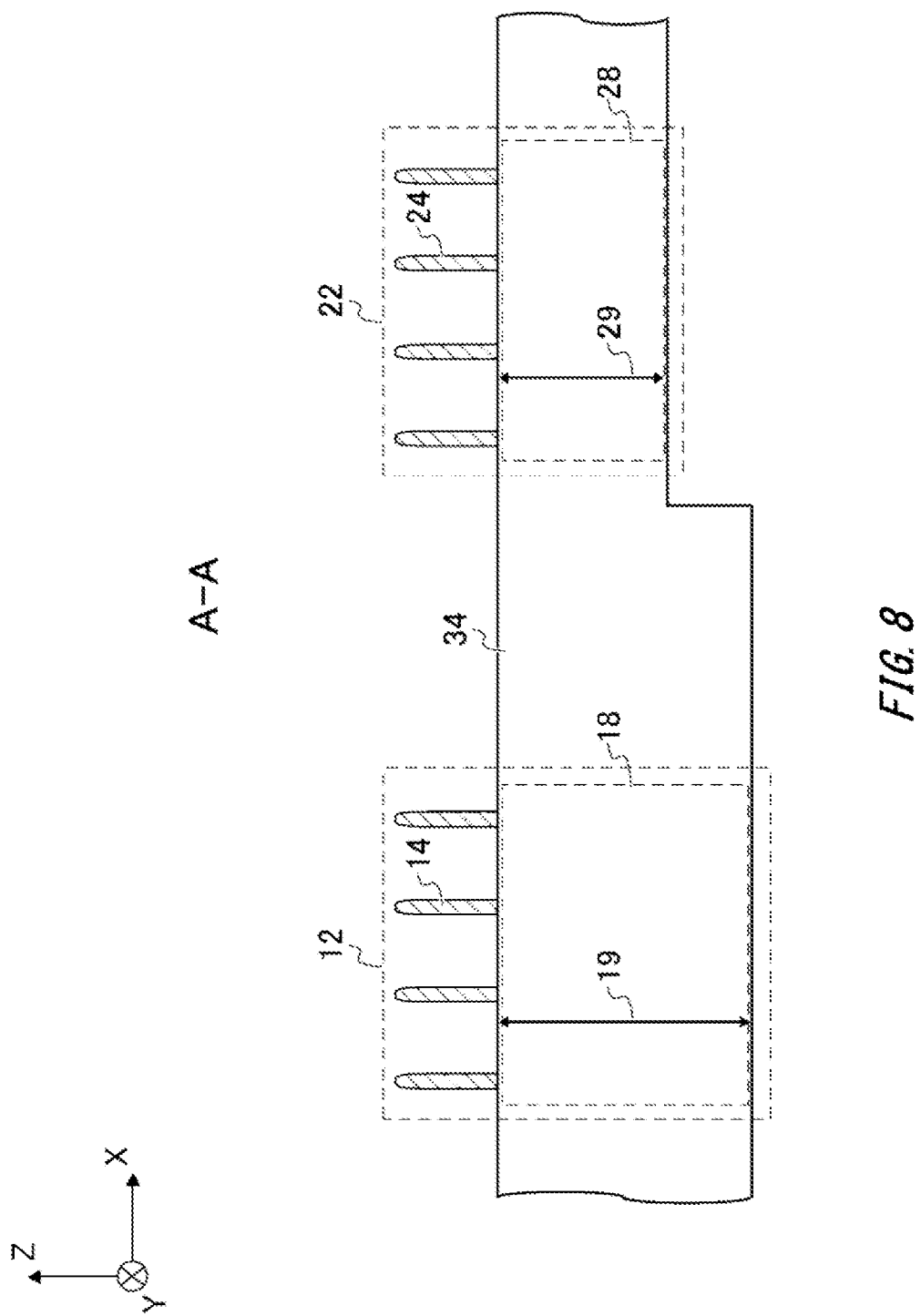
FIG. 8 is a cross-sectional view taken along A-A in FIG. 7.

FIG. 8 is a cross-sectional view taken along A-A in FIG. 7. The cross-sectional view taken along A-A is a cross-sectional view parallel with an X-Z plane passing through the first lead frame 34, first wires 14 and second wires 24. In the present example, $L_a$ of the first inductance portion 12 is made lower than $L_b$ of the second inductance portion 22 by making a thickness 19 of the first region 18 larger than a thickness 29 of the second region 28. Thereby, $L_a<L_b$ can be realized.

Figure 9:
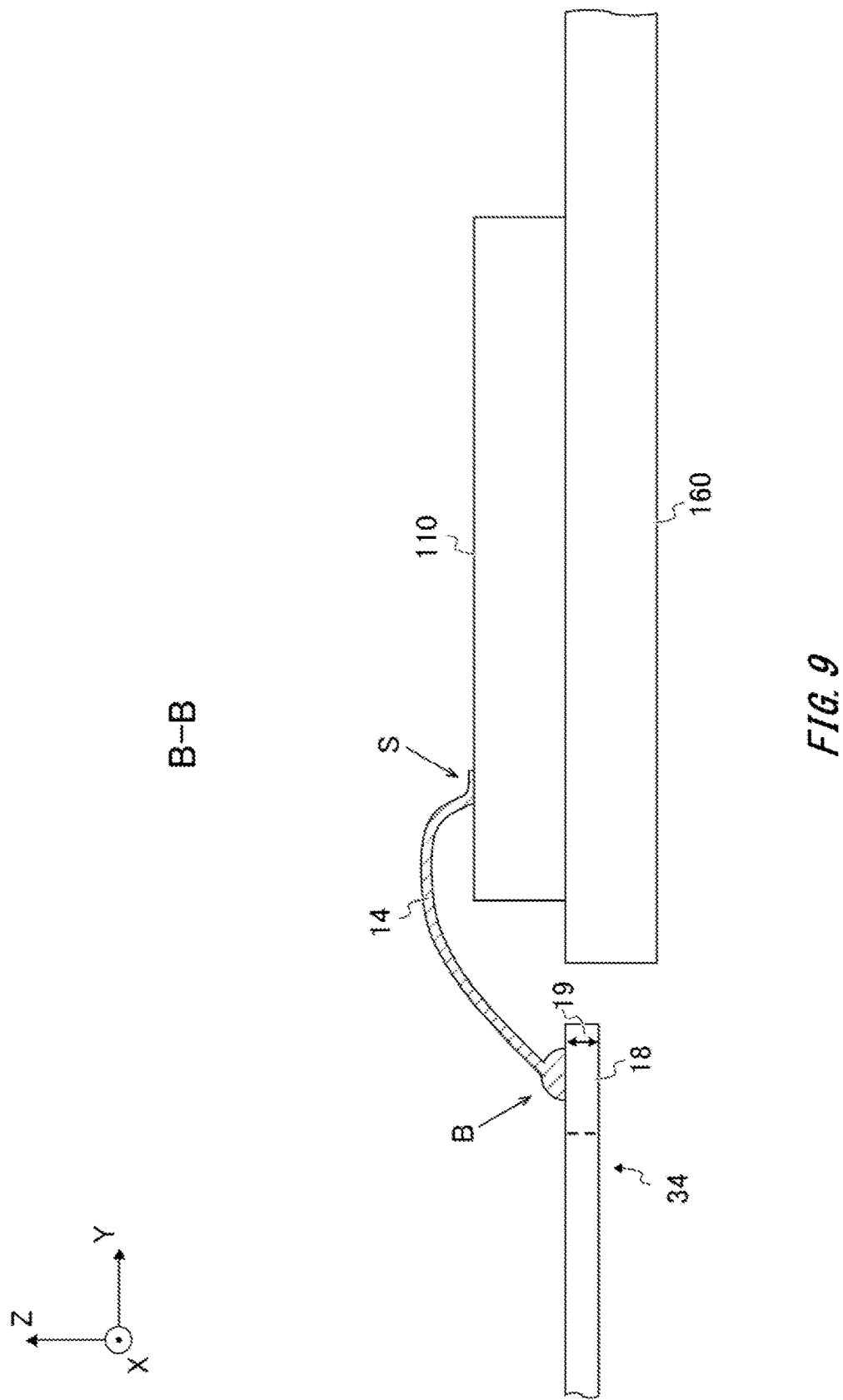
FIG. 9 is a cross-sectional view taken along B-B in FIG. 7.

FIG. 9 is a cross-sectional view taken along B-B in FIG. 7. The cross-sectional view take along B-B is a cross-sectional view parallel with a Y-Z plane passing through the first region 18 of the first lead frame 34, the circuit pattern substrate 160 and the first semiconductor chip 110. In the present example, the first wires 14 are ball-bonded on the first region 18 of the first lead frame 34 (shown in FIG. 9 as B), and is stitch-bonded on the first semiconductor chip 110 (shows in FIG. 9 as S). In this manner, in the Y-axis direction, the first wires 14 electrically connect with the first region 18 of the first lead frame 34 at one location, and electrically connect with the source 16 of the first semiconductor chip 110 at one location. The Y-axis direction is one example of a first direction.

In the first embodiment, the inductance $L_b$ is made high as compared with the inductance $L_a$ by (i) making the thickness 19 of the first lead frame 34 large as compared with the thickness 29. However, in order to realize $L_a<L_b$, the inductance $L_a$ may be made lower than the inductance $L_b$ by (ii) making the number of the first wires 14 smaller than the number of the second wires 24. In order to realize $L_a<L_b$, any one of (i) and (ii) may be applied, or all of them may be applied.

Figure 10:
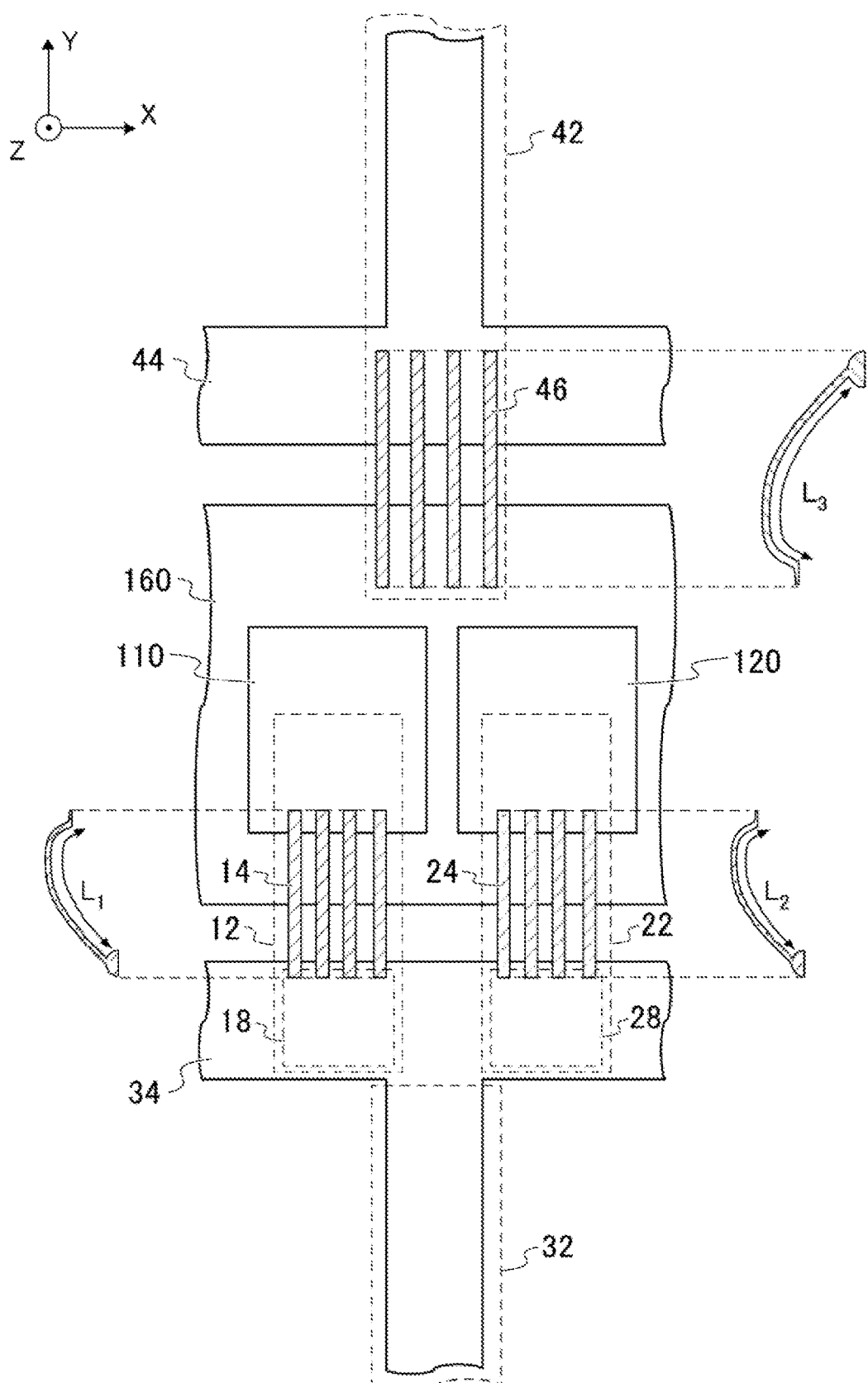
FIG. 10 is a figure showing a variant of first wires 14, second wires 24 and third wires 46.

FIG. 10 is a figure showing a variant of the first wires 14, second wires 24 and third wires 46. In the present example, a length $L_3$ of the third wires 46 is longer than both a length $L_1$ of the first wires 14 and a length $L_2$ of the second wires 24. A length L of wires does not mean a length of the wires in an X-Y plan view, but an actual length of the wires (for example, the length of the wires in a Y-Z plan view). Each wire in a Y-Z plan view is shown next to each wire. In the present example, $L_y$ of the fourth inductance portion 42 is made higher than both $L_a$ of the first inductance portion 12 and $L_b$ of the second inductance portion 22 by adjusting the lengths of the wires. Thereby, the sum of $L_x$ and $L_y$ can be made sufficiently larger than both $L_a$ and $L_b$.

Figure 11:
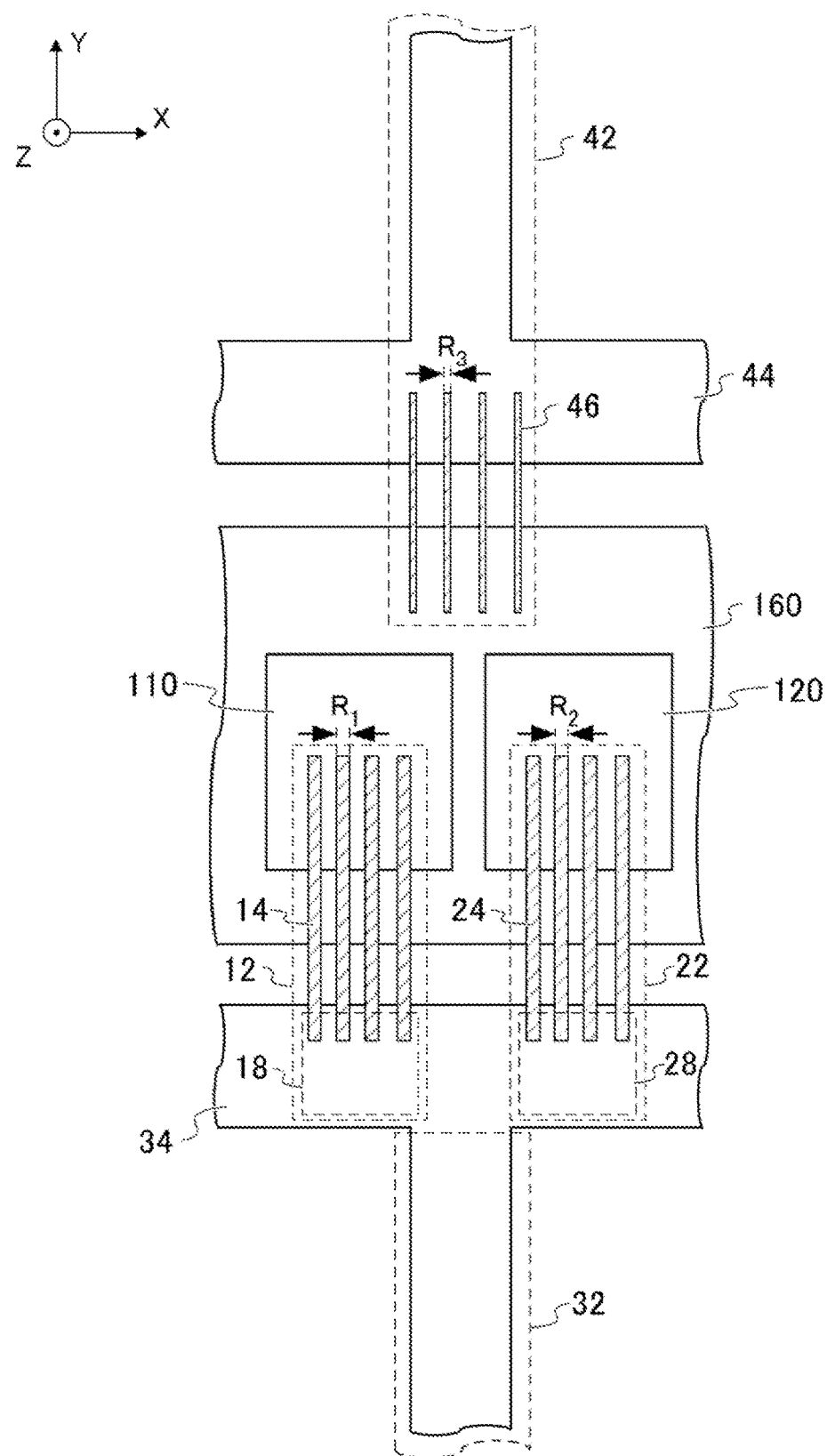
FIG. 11 is a figure showing another variant of the first wires 14, second wires 24 and third wires 46.

FIG. 11 is a figure showing another variant of the first wires 14, second wires 24 and third wires 46. In the present example, a diameter of $R_3$ of the third wires 46 is smaller than both a diameter $R_1$ of the first wires 14 and a diameter $R_2$ of the second wires 24. In the present example, $L_y$ of the fourth inductance portion 42 is made higher than both $L_a$ of the first inductance portion 12 and $L_b$ of the second inductance portion 22 by adjusting the diameters of the wires. Thereby, the sum of $L_x$ and $L_y$ can be made sufficiently larger than both $L_a$ and $L_b$.

Figure 12:
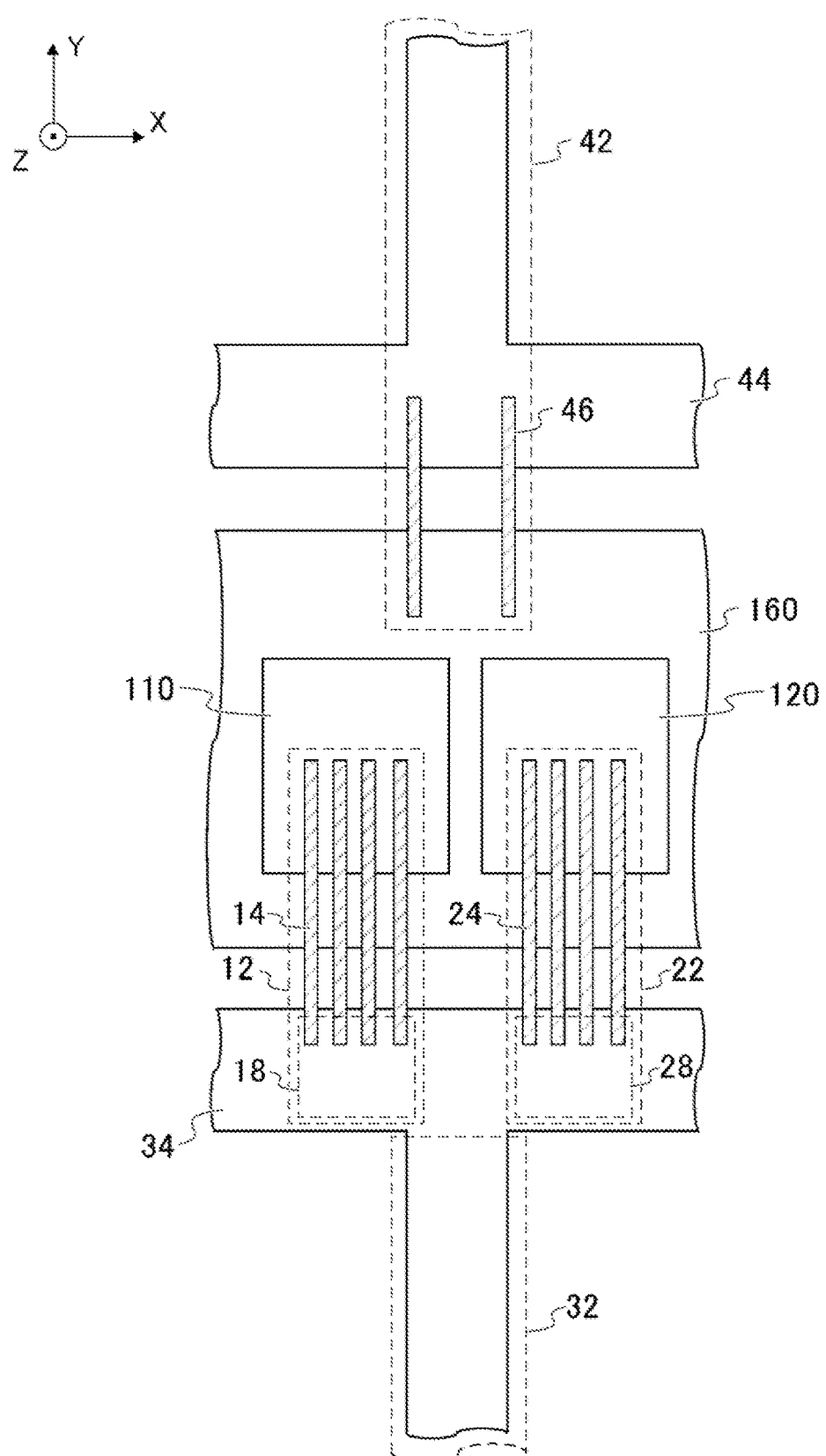
FIG. 12 is a figure showing another variant of the first wires 14, second wires 24 and third wires 46.

FIG. 12 is a figure showing another variant of the first wires 14, second wires 24 and third wires 46. The first inductance portion 12 may include one or more first wires 14, the second inductance portion 22 may include one or more second wires 24 and the fourth inductance portion 42 may include one or more third wires 46. In the present example, the fourth inductance portion 42 includes two first wires 14, and each of the first inductance portion 12 and second inductance portion 22 includes four wires. In the present example, the number of the third wires 46 is smaller than both the number of the first wires 14 and the number of the second wires 24. In this manner, $L_y$ of the fourth inductance portion 42 is made higher than both $L_a$ of the first inductance portion 12 and $L_b$ of the second inductance portion 22 by adjusting the numbers of the wires. Thereby, the sum of $L_x$ and $L_y$ can be made sufficiently larger than both $L_a$ and $L_b$.

In FIG. 10 to FIG. 12, the sum of $L_x$ and $L_y$ is made sufficiently larger than both $L_a$ and $L_b$ by making $L_y$ of the fourth inductance portion 42 high. However, the sum of $L_x$ and $L_y$ may be made sufficiently larger than both $L_a$ and $L_b$ by making $L_x$ of the third inductance portion 32 high. In addition, both $L_x$ and $L_y$ may be made high.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor apparatus comprising:
   a MOSFET portion;
   a diode portion connected in anti-parallel with the MOSFET portion;
   a first inductance portion that is connected in series with the MOSFET portion and has inductance which is $L_a$; and
   a second inductance portion that is connected in series with the diode portion and has inductance which is $L_b$, wherein
   reverse recovery current flows through the diode portion after reverse recovery current of the MOSFET portion becomes zero, and
   the $L_a$ of the first inductance portion is lower than the $L_b$ of the second inductance portion.

2. The semiconductor apparatus according to claim 1, wherein the diode portion has a forward voltage lower than a forward voltage of a parasitic diode of the MOSFET portion.

3. The semiconductor apparatus according to claim 1, wherein
   the first inductance portion has one or more first wires,
   the second inductance portion has two or more second wires, and
   the number of the first wires is smaller than the number of the second wires.

4. The semiconductor apparatus according to claim 1, wherein
   if it is assumed that:
     reverse recovery time of the MOSFET portion is $T_{rra}$; and
     in a parallel circuit portion that has the MOSFET portion and the first inductance portion, and the diode portion and the second inductance portion, and in which the MOSFET portion and the first inductance portion, and the diode portion and the second inductance portion are connected in parallel, voltage applied between a first connection point which is one end of the parallel circuit portion and a second connection point which is another end opposite to the one end of the parallel circuit portion is $V_{DD2}$;
     current flowing through the MOSFET portion is $I_{Fa}$; and
     current flowing through the diode portion is $I_n$, $$I_{Fa} \cdot L_a + T_{rra} \cdot V_{DD2} < I_{Fb} \cdot L_b.$$

5. The semiconductor apparatus according to claim 4, further comprising:
   a third inductance portion that is connected in series with the first connection point of the parallel circuit portion, is constituted by a part of a first lead frame and has inductance which is $L_x$; and
   a fourth inductance portion that is connected in series with the second connection point of the parallel circuit portion, is constituted by a part of a second lead frame and has inductance which is $L_y$, wherein
   a sum of the $L_x$ and the $L_y$ is sufficiently larger than both the $L_a$ and the $L_b$.

6. The semiconductor apparatus according to claim 5, wherein
the first inductance portion has:
a first wire; and
a first region of the first lead frame that is different from the part of the first lead frame and is in contact with the first wire,
the second inductance portion has:
a second wire; and
a second region of the first lead frame that is different from the part and the first region of the first lead frame and is in contact with the second wire, and
a thickness of the first region is larger than a thickness of the second region.

7. The semiconductor apparatus according to claim 5, wherein
the first inductance portion has a first wire,
the second inductance portion has a second wire,
the fourth inductance portion has a third wire, and
a length of the third wire is longer than both a length of the first wire and a length of the second wire or a diameter of the third wire is smaller than both a diameter of the first wire and a diameter of the second wire.

8. The semiconductor apparatus according to claim 5, wherein
the first inductance portion has one or more first wires,
the second inductance portion has one or more second wires,
the fourth inductance portion has one or more third wires, and
the number of the third wires is smaller than both the number of the first wires and the number of the second wires.

* * * * *